United States Patent
Artmann et al.

(10) Patent No.: US 10,778,166 B2
(45) Date of Patent: Sep. 15, 2020

(54) ENERGY SUPPLY UNIT FOR A TRAVELING WAVE TUBE

(71) Applicant: Tesat-Spacecom GmbH & Co. KG, Backnang (DE)

(72) Inventors: Jochen Artmann, Weissach Im Tal (DE); Gerhard Reinwald, Aspach (DE); Erik Seiter, Nordheim (DE); Frederik John, Bruchsal (DE)

(73) Assignee: Tesat-Spacecom GmbH & Co. KG (DE)

( * ) Notice: Subject to any disclaimer, the term of this patent is extended or adjusted under 35 U.S.C. 154(b) by 839 days.

(21) Appl. No.: 15/344,828

(22) Filed: Nov. 7, 2016

(65) Prior Publication Data
US 2017/0141745 A1 May 18, 2017

(30) Foreign Application Priority Data
Nov. 12, 2015 (DE) .......................... 10 2015 014 587

(51) Int. Cl.
*H03F 3/58* (2006.01)
*H01J 25/34* (2006.01)
(Continued)

(52) U.S. Cl.
CPC .................. *H03F 3/58* (2013.01); *H01J 23/34* (2013.01); *H01J 25/34* (2013.01); *H03F 1/54* (2013.01);
(Continued)

(58) Field of Classification Search
CPC ... H03F 3/58; H03F 3/189; H03F 1/54; H03F 2200/504; H03F 2200/451; H01J 25/34;
(Continued)

(56) References Cited

U.S. PATENT DOCUMENTS 2,611,832 A * 9/1952 Lapostolle .............. H01J 25/38
330/43
3,165,696 A * 1/1965 Poole ...................... H01J 25/38
455/20
(Continued)

FOREIGN PATENT DOCUMENTS

DE         4234771 C1    4/1994
EP         0 252 149 A1  1/1988
(Continued)

OTHER PUBLICATIONS

Jinan Ok, Sandeep kumar singh, and Sandhya Rani SR. "Design and Development of Grid Modulator for Transmitters" 9th International Radar Symposium India Dec. 10-14, 2013. pp. 1-3 (Year: 2013).*
(Continued)

*Primary Examiner* — Matthew M Barker
(74) *Attorney, Agent, or Firm* — Lerner, David, Littenberg, Krumholz & Mentlik, LLP

(57) ABSTRACT

An energy supply unit for a traveling wave tube is configured to transform a first voltage present at a low voltage interface into a second voltage providable at a high voltage interface. The second voltage is greater than the first voltage and corresponds to a required operating voltage of the traveling wave tube. The energy supply unit is configured to receive a signal pattern via a signal input interface and to output a control signal via a control interface to the traveling wave tube for operating the traveling wave tube based on the signal pattern and to gradually and/or iteratively align or adapt the control signal to the signal pattern being present at the signal input interface when changing an operating mode of the traveling wave tube. A power draw at the beginning of the switched-on state may increase slowly and voltage drops at the high voltage supply may be minimized.

12 Claims, 3 Drawing Sheets

(51) Int. Cl.
*H01J 23/34* (2006.01)
*G01S 7/03* (2006.01)
*H03F 1/54* (2006.01)
*H03F 3/189* (2006.01)

(52) U.S. Cl.
CPC .............. *H03F 3/189* (2013.01); *G01S 7/032* (2013.01); *H01J 2223/34* (2013.01); *H03F 2200/451* (2013.01); *H03F 2200/504* (2013.01)

(58) Field of Classification Search
CPC .................. H01J 23/34; H01J 2223/34; H01J 2237/3171; G01S 7/032
See application file for complete search history.

(56) References Cited

U.S. PATENT DOCUMENTS

| | | | | |
|---|---|---|---|---|
| 3,909,828 A | * | 9/1975 | Israel | G01S 7/36 342/15 |
| 3,946,322 A | * | 3/1976 | Katz | G01S 7/282 327/176 |
| 4,000,471 A | | 12/1976 | Pankow | |
| 4,002,932 A | * | 1/1977 | Zaslav | H03K 3/16 327/177 |
| 4,190,882 A | * | 2/1980 | Chevalier | H02M 3/3378 363/26 |
| 4,371,830 A | * | 2/1983 | Loucks | G05F 1/56 315/3.5 |
| 4,682,369 A | * | 7/1987 | Schrader | H03F 3/58 315/105 |
| 4,709,215 A | | 11/1987 | McClanahan et al. | |
| 4,754,176 A | * | 6/1988 | Jones | H03K 17/102 327/436 |
| 2009/0033228 A1 | | 2/2009 | Kobayashi et al. | |
| 2014/0227968 A1 | * | 8/2014 | Reinwald | H04B 7/18513 455/13.4 |
| 2014/0253230 A1 | | 9/2014 | Katz et al. | |

FOREIGN PATENT DOCUMENTS

EP       2 775 612 A1     9/2014
JP       H02 266280 A    10/1990

OTHER PUBLICATIONS

EP 16 19 5969 Search Report (dated Sep. 5, 2017).

* cited by examiner

ENERGY SUPPLY UNIT FOR A TRAVELING WAVE TUBE

FIELD OF THE INVENTION

The invention relates to an energy supply unit for a traveling wave tube, a traveling wave tube amplifier with such an energy supply unit and a radar system with a traveling wave tube amplifier, in particular with a traveling wave tube amplifier having an energy supply unit indicated here.

BACKGROUND OF THE INVENTION

Traveling wave tubes (TWT) or traveling wave tube amplifiers (TWTA) are used to amplify electric signals. They achieve high amplification factors and may deliver high power. Due to this reason, traveling wave tube amplifiers are often used as part of communication links, e.g. satellite radio signaling links, or also as part of radar systems as to generate and send out a primary signal which is reflected by objects in the surroundings of the radar system as a secondary signal, which secondary signal serves for environment mapping.

Typically, traveling wave tubes are driven with high voltages (1000 Volt or more). These high voltages are generated by the energy supply unit from a low voltage and are provided to the traveling wave tube. The low voltage is provided by the enclosing component (e.g., satellite or radar system). Drops of the high voltage may result from the high load steps (step change in load, sudden load variation) resulting from a sudden variation of the power draw or power input (the required power) when the traveling wave tube is switched on or switched off. Depending on the design of the energy supply unit, a controller unit and an input filter are provided as to keep fluctuations of the high voltage from affecting the low voltage and, hence, from influencing the onboard power system of the enclosing component.

As to keep feedback effects of fluctuations of the high voltage to the low voltage as small as possible, it may be required to provide complex and costly input filters and controllers.

BRIEF SUMMARY OF THE INVENTION

There may be a need to reduce the costs for and the complexity of the energy supply unit, in particular of the input filters and of the controllers for the coupling between the low voltage and the high voltage.

According to a first aspect, an energy supply unit for a traveling wave tube is provided. The energy supply unit is configured to transform a first voltage present at a low voltage interface into a second voltage which is providable at a high voltage interface, wherein the second voltage is greater than the first voltage and wherein the second voltage corresponds to a required operating voltage of the traveling wave tube. The energy supply unit is further configured to receive a signal pattern via a signal input interface and to output a control signal via a control interface to the traveling wave tube for operating the traveling wave tube based on the signal pattern. The energy supply unit is further configured to gradually and/or iteratively align or adapt the control signal to the signal pattern being present at the signal input interface when changing an operating mode of the traveling wave tube.

The energy supply unit as described herein is suitable for a pulsed traveling wave tube in a radar system, in particular.

The second voltage is in the range of multiple kilovolt (kV), for example between 3.000 Volt and 15.000 Volt.

Pulsed traveling wave tubes are used in radar systems, for example. A radar system sends out a primary signal and receives reflections (so-called secondary signals) of this primary signal from objects. A map of the surroundings may be created based on the secondary signals. A pulsed traveling wave tube may be used for generating the primary signal. The pulsed traveling wave tube sends out a signal sequence (primary signal), wherein the signal sequence is a plurality of signals which are sent, for example, as consecutive pulses. There is an interrupt or a break of uniform or varying duration (depending on the desired signal sequence) between two consecutive pulses of the primary signal. The pulses of the signal sequence may be of uniform or varying duration.

The primary signal is generated by the traveling wave tube according to the control signal. Thereby, the primary signal, that is the sent out or transmitted high frequency (HF) signal, is particularly generated based on the control signal and a HF pulse, wherein the control signal activates the traveling wave tube and a HF pulse being present at an HF input of the traveling wave tube is amplified. The control signal is generated by the energy supply unit according to the signal pattern which is provided to the energy supply from external. In case of a pulsed traveling wave tube in a radar system, the signal pattern is predetermined by the radar system and, based thereon, the energy supply unit generates a control signal for the traveling wave tube. Thus, the signal pattern being present at the signal input interface is a nominal value for shaping the primary signal, whereas the control signal is created based on this nominal value as to generate the corresponding primary signal by the traveling wave tube.

In turn, the traveling wave tube accesses the high voltage as to generate a primary signal according to the control signal. In other words, the control signal defines a period of time in which the HF pulse being present at or being applied to the HF input of the traveling wave tube is amplified. Thereby, the duration of the control signal during operation of the traveling wave tube may be slightly longer than the duration of the HF pulse being present at or being applied to the HF input.

In the context of this description, particularly the two states switched on and switched off are to be understood and are distinguished from each other when referring to the operating mode of the traveling wave tube. In the switched-on state, the primary signal is generated based on the control signal; this state may also be referred to as a pulsed state as the primary signal is sent as a pulsed signal in this state. The switched-on state does also encompass the case that no primary signal is generated and sent out between two primary signal pulses for a limited period of time. The second voltage may be at a predetermined nominal value in the switched-on state, i.e., the second voltage is provided independent of it being accessed by the traveling wave tube as to generate the primary signal. It is noted that the traveling wave tube may be supplied by a multitude of supply voltages. No primary signal is generated in the switched-off state, in particular the second voltage is not provided in this state.

In case the operating mode is changed, i.e., the traveling wave tube (and with this the energy supply unit) is brought from the switched-off state to the switched-on state (or vice versa), the control signal is not generated immediately and directly according to the signal pattern being present at the signal input interface, but there happens a gradual (stepwise)

or continuous alignment or approximation of the control signal to the predetermined signal pattern. In particular, such an alignment or approximation relates to the shaping of the control signal from a temporal point of view and relating to its level (amplitude or intensity) in comparison to the predetermined signal pattern. If the control signal is a pulsed signal, a stepwise alignment may in particular indicate that the named parameters of the control signal are varied with each pulse so that the shaping of a control signal pulse approximates the shaping of a signal pattern pulse.

The power draw (the power taken, the power consumption) or the required power of a pulsed traveling wave tube is substantially dependent on the duty cycle and the amplitude of the signal pattern (may also be referred to as level of the grid voltage which is provided by a radar system as the signal pattern). If the grid voltage is switched off, the traveling wave tube does not consume any power, i.e., the energy supply unit is in an idle state in terms of the power output to be provided. If the grid voltage is switched on and off according to the signal pattern, that is, the traveling wave tube is brought from the switched-off state into the pulsed state, this corresponds to a load step at the energy supply unit from idle state to full load. This typically results in a high voltage drop as the energy supply unit requires a certain time as to readjust or control correspondingly. However, it may be required to keep the high voltage (second voltage) within certain limits (tolerance). For example, this may be achieved by means of a fast controller, wherein a fast controller may result in the input side (first voltage) of the energy supply unit also being subject to fluctuations of the received power, which may not be desired.

As to overcome these drawbacks, it is provided that the control signal is approximated to the signal pattern when changing the operating mode of the traveling wave tube as to avoid a load step of the traveling wave tube and, hence, a drop of the high voltage at the high voltage interface. Due to the fact that the signal pattern is not directly transformed into a corresponding control signal and transmitted to the traveling wave tube, the load at the high voltage interface increases continuously so that the resulting load step (and, hence, the drop of the high voltage) is reduced.

A control signal is generated when switching on the traveling wave tube and the energy supply unit, which control signal results in an increasing power draw of the traveling wave tube until that power is achieved which is required by the signal pattern, and thereupon the control signal is generated directly according to the signal pattern. Conversely, a control signal is generated when switching off the traveling wave tube and the energy supply unit, which control signal stepwisely approximates the zero level (despite of no signal pattern being present at the signal input interface anymore), thereby likewise avoiding a high load step.

According to an embodiment, the energy supply unit is configured to stepwisely (in a step by step manner) align or adapt the duration of a pulse of the control signal to the duration of a pulse of the signal pattern being present at the signal input interface when changing an operating mode of the traveling wave tube.

The duration of a pulse significantly influences the power draw of the traveling wave tube. If the duration of a pulse at the beginning of an operating state (when switching on or when switching off) is not abruptly set to the duration of a pulse of the signal pattern (that is, to the nominal value), this may reduce the extent of the load step at the high voltage interface. The energy supply unit may comprise a control unit which is configured to generate the control signal and to vary the duration of the pulses of the control signal.

In an initial phase of an operating state, the control signal is aligned or approximated to the predetermined signal pattern. Either the control signal is adapted when switching on so that the delivered power is stepwisely increased until the control signal corresponds to the signal pattern or the control signal is stepwisely lowered towards zero when switching off, in particular after switching off, so that the delivered power is stepwisely reduced. In any case, starting from the control signal of the current state (switched on or switched off), a control signal corresponding to the signal pattern of the other state (switched off or switched on) is stepwisely approximated, namely during an initial phase of the new operating state.

The initial phase of an operating state may be referred to as signal alignment phase, which in particular describes the duration for aligning the control signal to the signal pattern until the control signal corresponds to the signal pattern or until the nominal value predetermined by the signal pattern is achieved. During this signal alignment phase, the duration of the control signal may be shorter than the duration of the HF pulse being present at the HF input of the traveling wave tube as to thereby reduce the power drawn at the HF input.

According to a further embodiment, the energy supply unit is configured to stepwisely align or adapt an amplitude of the control signal to the nominal amplitude predetermined by the signal pattern when changing an operating mode of the traveling wave tube.

Alternatively or additionally to increasing the duration of a pulse of the control signal in the signal alignment phase (the duration for aligning the control signal to the signal pattern until the control signal corresponds to the signal pattern or until the nominal value predetermined by the signal pattern is achieved), the amplitude (in particular a voltage level of the pulses) may be stepwisely adapted with every pulse.

According to a further embodiment, the energy supply unit is configured to stepwisely align or adapt the control signal to the signal pattern being present at the signal input interface when switching on the traveling wave tube by increasing a power provided to the traveling wave tube in accordance with the control signal after switching on and during a signal alignment phase.

The control signal influences the power drawn by the traveling wave tube. However, if the control signal is low (low duration of a pulse and/or low amplitude) at the beginning of the signal alignment phase after switching on the traveling wave tube, the load step at the high voltage interface of the energy supply unit will, hence, be low. Likewise, the load step or the load variation is kept low due to the stepwise approximation (during the pulse sequence of the control signal, this continues to approximate the predetermined signal pattern) of the control signal to the predetermined signal pattern. In one embodiment, the alignment may be accomplished such that the amplitude and/or the duration of each n-th pulse (wherein n is a natural number equal to or greater than 2) is aligned to the predetermined signal pattern. Hence, the load increase may be slowed down, for example by aligning every third pulse while the respectively subsequent two pulses correspond to the directly preceding pulse.

According to a further embodiment, the energy supply unit is configured to stepwisely reduce the control signal when switching off the traveling wave tube by reducing a power provided to the traveling wave tube until the provided power lowers down to zero after switching off and during a signal alignment phase.

As to not cause an abrupt, high load variation when switching off the traveling wave tube (i.e., that the energy supply unit does not provide power to the traveling wave tube anymore in an abrupt manner or the traveling wave tube does not draw power from the energy supply unit anymore), the energy supply unit still provides a control signal to the traveling wave tube despite of no signal pattern is applied from externally, so that the power drawn by the traveling wave tube is stepwisely reduced until it achieves zero.

Hence, the energy supply unit is configured to provide a first signal alignment phase at the beginning of operation of the traveling wave tube and/or to provide a second signal alignment phase after ending the operation of the traveling wave tube, wherein in both signal alignment phases, the control signal stepwisely adopts a nominal value indicated by a predetermined signal pattern. Each one of these two signal alignment phases may, for example, have a duration of several μs ($1 \times 10^{-6}$ seconds) up to several ms ($1 \times 10^{-3}$ seconds), for example 1 to 10 ms, and may comprise between 5 and 15 pulses, depending on the indicated pulse repetition rate.

Hence, the first 5 to 15 pulses of the control signal may be stepwisely increased during the first signal alignment phase until the control signal corresponds to the predetermined signal pattern beginning with that pulse which follows the signal alignment phase. In a radar system, the required primary signal will be provided only after the signal alignment phase. However, due to the very short duration of the signal alignment phase, this delay is negligible in most use cases. During the second signal alignment phase, the lastly applied signal pattern is output as a stepwisely reduced control signal after switching off the traveling wave tube. In other words, this second signal alignment phase is appended to the end of the operation of the traveling wave tube, whereas the first signal alignment phase can be, naturally, provided only after the switching on of the traveling wave tube.

For example, the signal pattern may have a pulse repetition rate of about 100 Hertz up to several kHz (e.g., 1 to 25 kHz), wherein the signal alignment phase may extend up to 20 pulses, in particular 5 to 15 pulses.

According to a further aspect, a traveling wave tube amplifier is provided which comprises a traveling wave tube and an energy supply unit as described above and hereinafter. Thereby, the traveling wave tube is coupled with the control interface and the high voltage interface of the energy supply unit, so that power is drawn via the high voltage interface in accordance with a control signal received via the control interface.

According to an embodiment of the invention, the traveling wave tube amplifier is a pulsed traveling wave tube amplifier.

According to another aspect, a radar system is provided which comprises a radar control unit and a traveling wave tube amplifier with an energy supply unit and with a traveling wave tube, wherein the traveling wave tube amplifier is coupled with the radar control unit so that a signal pattern may be provided by the radar control unit to the traveling wave tube amplifier, wherein the traveling wave tube amplifier is further configured to generate a primary signal in accordance with the signal pattern of the radar control unit and to send out (emit) this primary signal, and wherein the radar control unit is configured to stepwisely approximate the signal pattern to a nominal value during a signal alignment phase when changing an operating mode of the traveling wave tube amplifier.

Relating to the operating mode of the traveling wave tube amplifier, reference is made to the description of the energy supply unit and the traveling wave tube, which applies in a similar manner here. The radar control unit generates the signal pattern so that it is already here taken into account that no abrupt and great load steps happen when changing the operating mode of the traveling wave tube amplifier. The nominal value referred to in this context may, in particular, refer to the duration and the amplitude of a pulse.

In other words, the shape and/or the duration of the pulses is stepwisely approximated to the nominal value of the pulses during the signal alignment phase, whereas nothing else happens as during alignment of the control signal to the signal pattern described in detail with reference to the energy supply unit (due to this reason, the explanations relating to the power draw by the traveling wave tube and the shaping of the control signal apply in an analogous manner to the radar system and the shaping of the signal pattern).

Hence, due to this design of the radar control unit, a similar effect is achieved as by the alignment of the control signal of the energy supply unit to the signal pattern, namely avoiding of great load steps due to a change of the operating mode of the traveling wave tube.

The radar control unit requests a primary signal from the traveling wave tube amplifier by outputting a signal pattern so that the traveling wave tube amplifier generates a corresponding primary signal and sends out this primary signal as a pulsed signal, so that these pulses are reflected by objects in the detection field of the radar system as secondary signal.

According to an embodiment of the invention, the radar control unit is configured to stepwisely extend the duration and/or to stepwisely increase the amplitude of pulses of the signal pattern during a signal alignment phase after switching on the traveling wave tube amplifier.

This results in a stepwise increasing of the power drawn by the traveling wave tube when changing the operating mode (here: switching on), so that the resulting load steps at the high voltage interface of the energy supply unit are kept small or low.

According to a further embodiment of the invention, the radar control unit is configured to stepwisely shorten the duration and/or to stepwisely reduce the amplitude of pulses of the signal pattern during a signal alignment phase after switching off the traveling wave tube amplifier.

This results in a stepwise reduction of the power drawn by the traveling wave tube when changing the operating mode (here: switching off), so that the resulting load steps at the high voltage interface of the energy supply unit are kept small or low.

According to a further embodiment of the invention, the traveling wave tube amplifier of the radar system is a traveling wave tube amplifier as described above, i.e., comprises an energy supply unit described above and hereinafter.

Hence, on the one hand, the signal pattern of the radar control unit may comprise a signal alignment phase, and, on the other hand, the control signal generated by the energy supply unit may be stepwisely approximated to this signal pattern during the signal alignment phase. This combination may have the effect that the power draw at the beginning of the signal alignment phase is even lower.

An aspect of the energy supply unit and of the radar control unit may be described as follows:

During the signal alignment phase, the signal pattern (the drive pulses) is slightly increased within the energy supply unit (also: electronic power conditioner, EPC), it is smaller than required (when switching on) or it is slowly reduced and is present even if not required any more (when switching off). For this purpose, the control unit of the energy supply unit or the radar control unit may comprise a corresponding circuit, for example designed as an ASIC (application specific integrated circuit) or an FPGA (field programmable gate array). This shaping of the signal alignment phases may be referred to as soft start (when switching on) or soft stop (when switching off) and may take place in the energy supply unit or in a component arranged upstream of the energy supply unit, e.g., in the radar control unit. Thus, a non-abrupt rise of the TWT load is enabled. In particular, the dynamic requirements to the controller in the energy supply unit are significantly simplified hereby and the transient response of the controlled high voltage is improved.

BRIEF DESCRIPTION OF THE DRAWINGS

In the following, exemplary embodiments of the invention are described in more detail with reference to the attached drawings. The drawings are schematic and not to scale. It is shown in.

DETAILED DESCRIPTION

Figure 1:
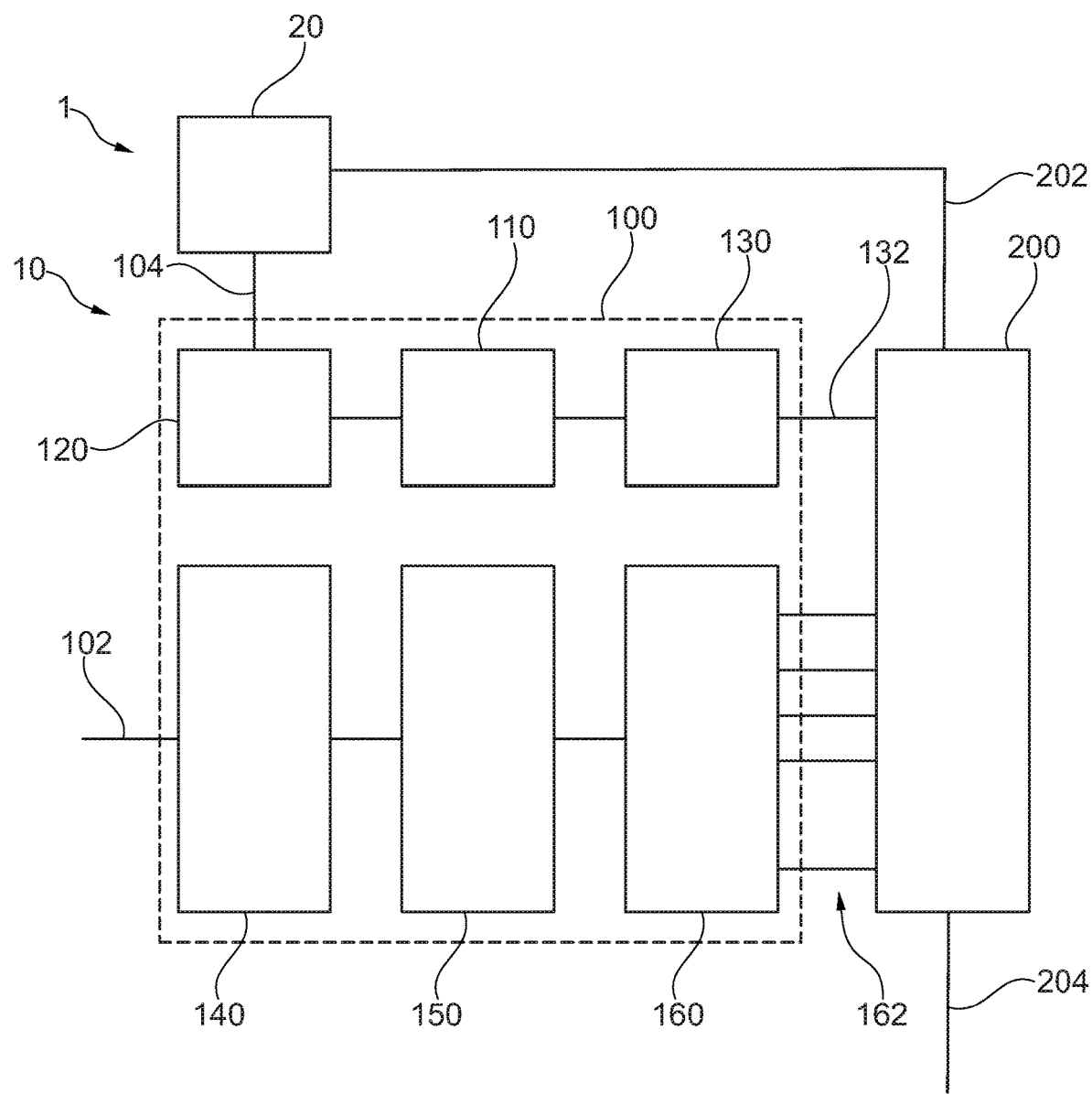
FIG. 1 a radar system with a traveling wave tube amplifier comprising an energy supply unit according to an exemplary embodiment of the invention.

FIG. 1 shows a radar system 1 which comprises a radar control unit 20 and a traveling wave tube amplifier 10. The traveling wave tube amplifier 10 comprises an energy supply unit 100 and a traveling wave tube 200.

The energy supply unit 100 comprises a low voltage interface 102 for connecting to an energy supply network (power network, power grid, not shown) of the radar system and a high voltage interface 162 for providing energy to the traveling wave tube 200. In a first functional branch for transforming the low voltage into a high voltage, the energy supply unit 100 comprises an input filter 140, a controller unit 150, and a high voltage generation unit 160. It is noted that in other exemplary embodiments, these functions may be partially omitted or at least two of them may be combined within a single functional block.

The radar control unit 20 is coupled with the energy supply unit 100 via a signal input interface 104 via which the signal pattern for generating the primary signal by the traveling wave tube 200 is transmitted. A second functional branch is provided as to transform the signal pattern of the radar control unit 20 into a control signal and to forward it to the traveling wave tube. Within this functional branch, the energy supply unit 100 comprises a signal receiver 120, a control unit 110, and a modulation unit 130. It is noted that in other exemplary embodiments, these functions may be partially omitted or at least two of them may be combined within a single functional block.

As already described above, the radar control unit 20 as well as the control unit 110 of the energy supply unit 100 may be configured to stepwise increase or stepwisely reduce a duration of a pulse and/or an amplitude of the signal pattern or of the control signal during a signal alignment phase when changing the operating mode of the traveling wave tube as to avoid a great load step at the high voltage interface 162.

A HF signal to be amplified by the traveling wave tube 200 is likewise sent by the radar control unit 20 to the traveling wave tube via the HF input 202. This HF signal is amplified in accordance with the control signal at the control interface 132 and the high voltages at the high voltage interface 162 and is sent out as primary signal at the HF output 204.

Figure 2:
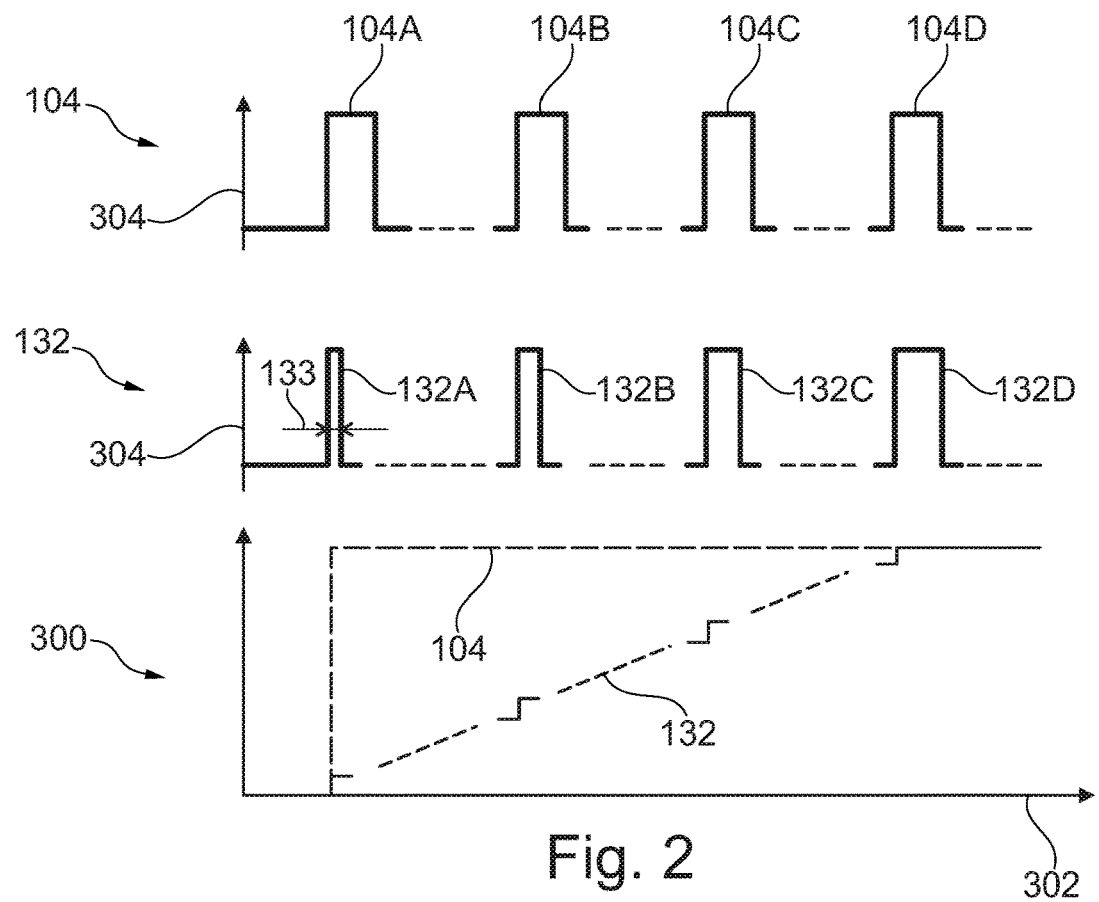
FIG. 2 a signal alignment phase with varying duration of a pulse as well as a qualitatively represented power draw of a traveling wave tube.
Figure 3:
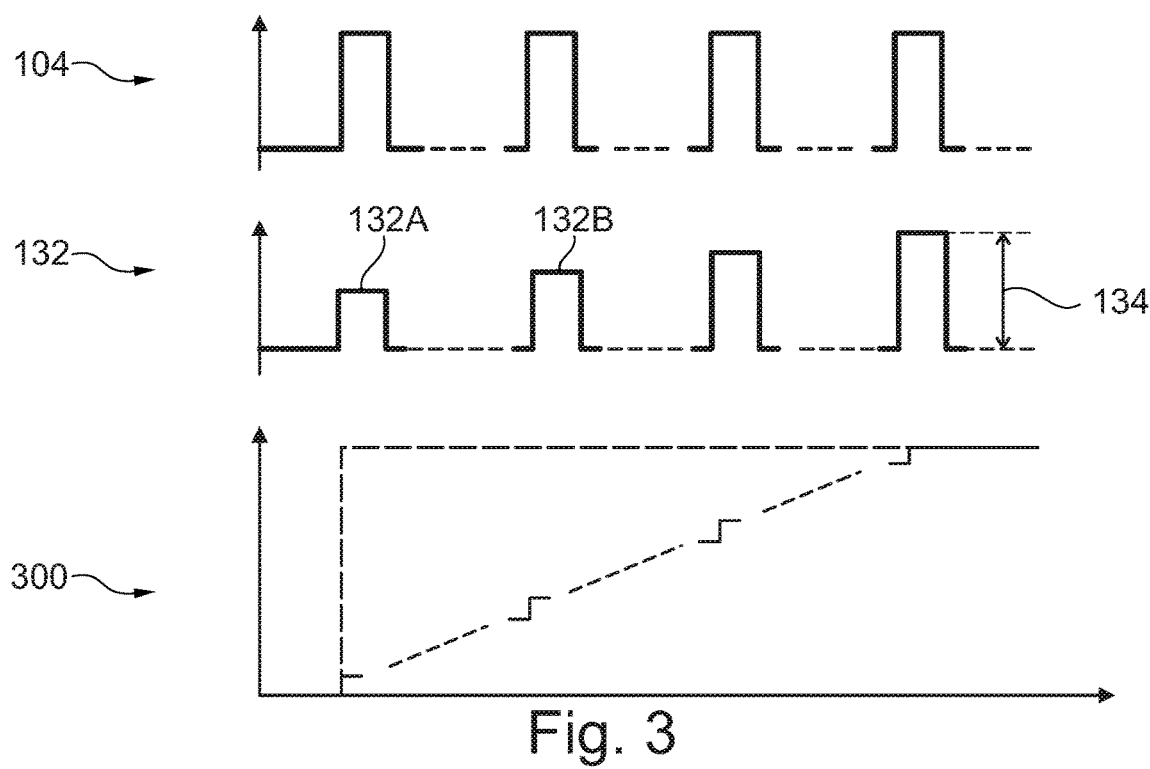
FIG. 3 a signal alignment phase with varying amplitude as well as a qualitatively represented power draw of a traveling wave tube.
Figure 4:
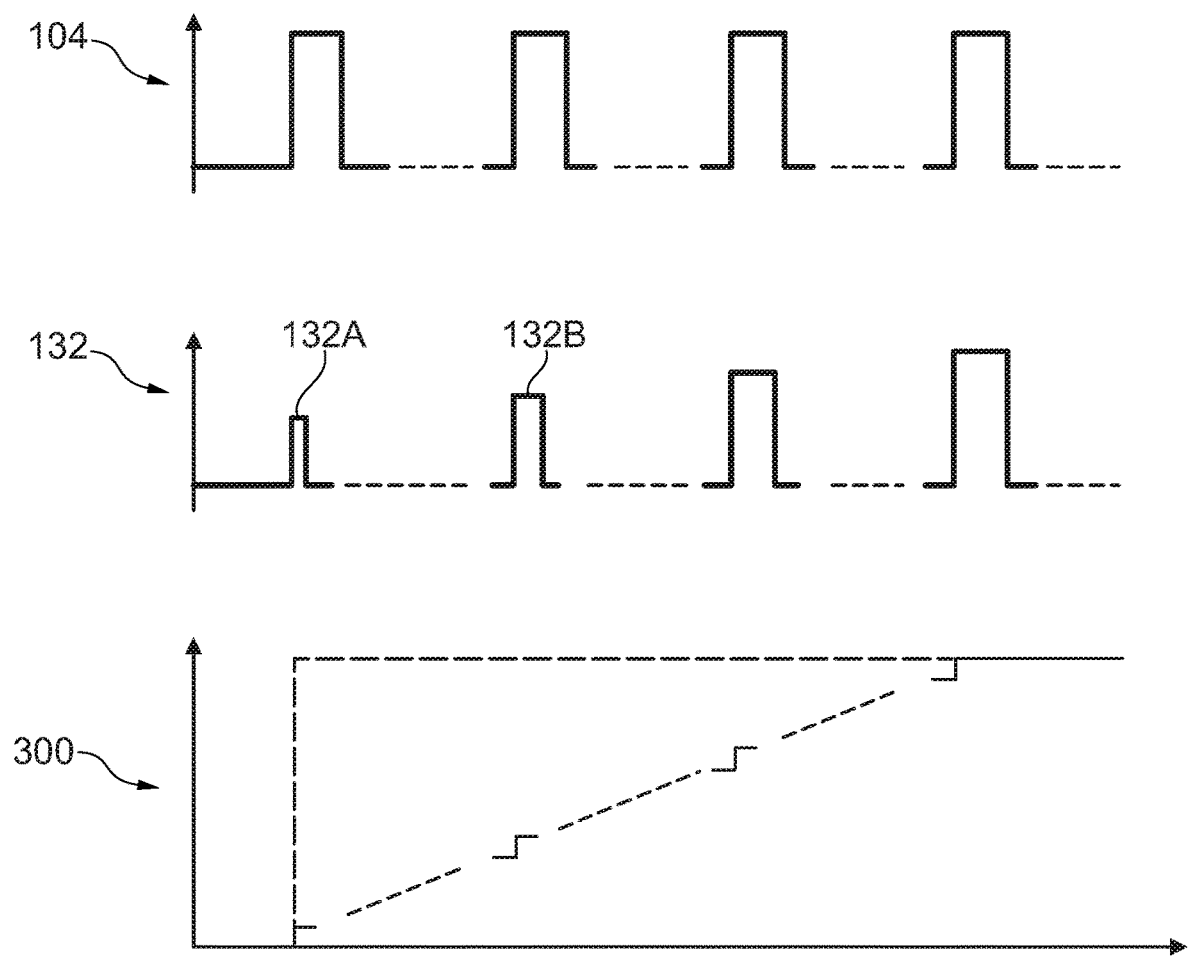
FIG. 4 a signal alignment phase with varying duration of a pulse and varying amplitude as well as a qualitatively represented power draw of a traveling wave tube.

FIGS. 2 to 4 show how the control unit 110 can vary the control signal at the control interface 132 during a signal alignment phase starting from a uniform signal pattern at the signal input interface 104. The figures show the voltage course 304 over the time 302 in the upper and middle chart, respectively, and the bottom chart shows the power draw of the traveling wave tube via the high voltage interface 162 over the time.

The respective upper chart shows the signal pattern at the signal input interface 104. This is depicted as periodic, pulsed signal with the individual equal pulses 104A, 104B, 104C, and 104D.

The respective middle chart shows the generated control signal which is present at the control interface 132. The control signal comprises the pulses 132A, 132B, 132C, and 132D.

In the middle chart of FIG. 2, it is depicted that the duration of a pulse of the control signal increases, so that the pulses 132A, 132B, 132C, and 132D are getting wider. The four pulses shown here may represent the signal alignment phase, wherein the next pulse (the fifth pulse) then corresponds to the fifth pulse of the signal being present at the signal input interface.

In the bottom chart of FIG. 2, there is shown the power draw for the two cases of the upper and middle chart. The power draw which results if the signal pattern at the signal input interface is directly forwarded as the control signal, that is, without any reduction of the power draw, is provided with the reference sign 104. It is apparent that here a great power step (load step) takes place at the beginning of the operating mode. In contrast thereto, the power draw increases slowly and stepwisely in case of using a signal alignment phase, and not with a great step, see reference sign 132.

A similar representation can be derived from FIG. 3, wherein here and in contrast to FIG. 2, the amplitude of the control signal is varied instead of the duration of a pulse. It can be seen that the amplitude of the pulses 132A, 132B, 132C, and 132D is stepwisely increased until the amplitude 134 (nominal value) is achieved.

The power draw at the high voltage interface is qualitatively comparable to what is shown in FIG. 2.

In FIG. 4, it is shown in the middle chart that the pulses 132A, 132B, 132C, and 132D are varied during the signal alignment phase with respect to their duration of a pulse 133 as well as with respect to their amplitude 134.

In the FIGS. 2 to 4, the switching on of the traveling wave tube is shown. For switching off, it is reduced from a high value (duration of a pulse and/or amplitude of the pulses 132A, 132B, 132C, and 132D) to a low value, i.e., conversely as shown in the FIGS. 2 to 4.

It is noted that the explanations with regard to the shaping of the control signal do also apply to a signal alignment phase of the signal pattern being present at the signal input interface 104 and in case that the radar control unit 20 slowly approximates the signal pattern to a nominal value at the beginning or at the end of the switched-on state.

LIST OF REFERENCE SIGNS 1 radar system
10 traveling wave tube amplifier
20 radar control unit
100 energy supply unit
102 low voltage interface
104 signal input interface
110 control unit
120 signal receiver
130 modulation unit
132 control interface
133 duration of pulse
134 amplitude
140 input filter
150 controller unit
160 high voltage generation unit
162 high voltage interface
200 traveling wave tube
202 HF input
204 HF output
300 power draw
302 time
304 voltage/amplitude While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An energy supply unit for a traveling wave tube:
wherein the energy supply unit is configured to transform a first voltage present at a low voltage interface into a second voltage which is providable at a high voltage interface, wherein the second voltage is greater than the first voltage and wherein the second voltage corresponds to a required operating voltage of the traveling wave tube,
wherein the energy supply unit is configured to receive a signal pattern via a signal input interface and to output a control signal via a control interface to the traveling wave tube for operating the traveling wave tube based on the signal pattern,
wherein the energy supply unit is configured to stepwisely adapt the control signal to the signal pattern present at the signal input interface when changing an operating mode of the traveling wave tube, and
wherein the energy supply unit is configured to stepwisely adapt an amplitude of the control signal to a nominal amplitude predetermined by the signal pattern present at the signal input interface when changing an operating mode of the traveling wave tube.

2. The energy supply unit of claim 1, wherein the energy supply unit is configured to stepwisely adapt the duration of a pulse of the control signal to the duration of a pulse of the signal pattern present at the signal input interface when changing the operating mode of the traveling wave tube.

3. The energy supply unit of claim 1, wherein the energy supply unit is configured to stepwisely adapt the control signal to the signal pattern present at the signal input interface when switching on the traveling wave tube by increasing a power provided to the traveling wave tube in accordance with the control signal after switching on and during a signal alignment phase.

4. An energy supply unit for a traveling wave tube:
wherein the energy supply unit is configured to transform a first voltage present at a low voltage interface into a second voltage which is providable at a high voltage interface, wherein the second voltage is greater than the first voltage and wherein the second voltage corresponds to a required operating voltage of the traveling wave tube,
wherein the energy supply unit is configured to receive a signal pattern via a signal input interface and to output a control signal via a control interface to the traveling wave tube for operating the traveling wave tube based on the signal pattern,
wherein the energy supply unit is configured to stepwisely adapt the control signal to the signal pattern present at the signal input interface when changing an operating mode of the traveling wave tube, and
wherein the energy supply unit is configured to stepwisely reduce the control signal when switching off the traveling wave tube by reducing a power provided to the traveling wave tube until the provided power lowers down to zero after switching off and during a signal alignment phase.

5. The energy supply unit of claim 4, wherein the energy supply unit is configured to stepwisely adapt the duration of a pulse of the control signal to the duration of a pulse of the signal pattern present at the signal input interface when changing the operating mode of the traveling wave tube.

6. The energy supply unit of claim 4, wherein the energy supply unit is configured to stepwisely adapt an amplitude of the control signal to a nominal amplitude predetermined by the signal pattern present at the signal input interface when changing an operating mode of the traveling wave tube.

7. The energy supply unit of claim 4, wherein the energy supply unit is configured to stepwisely adapt the control signal to the signal pattern present at the signal input interface when switching on the traveling wave tube by increasing a power provided to the traveling wave tube in accordance with the control signal after switching on and during a signal alignment phase.

8. A traveling wave tube amplifier, comprising:
an energy supply unit; and
a traveling wave tube,
wherein the energy supply unit is configured to transform a first voltage present at a low voltage interface into a second voltage which is providable at a high voltage interface, wherein the second voltage is greater than the first voltage and wherein the second voltage corresponds to a required operating voltage of the traveling wave tube,
wherein the energy supply unit is configured to receive a signal pattern via a signal input interface and to output a control signal via a control interface to the traveling wave tube for operating the traveling wave tube based on the signal pattern, wherein the energy supply unit is configured to stepwisely adapt the control signal to the signal pattern being present at the signal input interface when changing an operating mode of the traveling wave tube, wherein the energy supply unit is configured to stepwisely adapt an amplitude of the control signal to a nominal amplitude predetermined by the signal pattern present at the signal input interface when changing an operating mode of the traveling wave tube, and wherein the traveling wave tube is coupled with the control interface and with the high voltage interface of the energy supply unit, so that a power received via the high voltage interface is drawn in accordance with a control signal received via the control interface.

9. The traveling wave tube amplifier of claim 8, wherein the traveling wave tube amplifier is a pulsed traveling wave tube amplifier.

10. The traveling wave tube amplifier of claim 8, wherein the energy supply unit is configured to stepwisely adapt the duration of a pulse of the control signal to the duration of a pulse of the signal pattern present at the signal input interface when changing the operating mode of the traveling wave tube.

11. The traveling wave tube amplifier of claim 8, wherein the energy supply unit is configured to stepwisely adapt the control signal to the signal pattern present at the signal input interface when switching on the traveling wave tube by increasing a power provided to the traveling wave tube in accordance with the control signal after switching on and during a signal alignment phase.

12. The traveling wave tube amplifier of claim 8, wherein the energy supply unit is configured to stepwisely reduce the control signal when switching off the traveling wave tube by reducing a power provided to the traveling wave tube until the provided power lowers down to zero after switching off and during a signal alignment phase.

* * * * *